United States Patent
Hamanishi et al.

Patent Number: 5,870,045
Date of Patent: Feb. 9, 1999

[54] D/A CONVERTER

[75] Inventors: Naoyuki Hamanishi, Chiba-ken; Kazuhiro Oda; Zdzislaw Czarnul, both of Kanagawa-ken, all of Japan

[73] Assignee: Kabushiki Kaisha Toshiba, Kawasaki, Japan

[21] Appl. No.: 919,316

[22] Filed: Aug. 28, 1997

[30] Foreign Application Priority Data

Sep. 30, 1996 [JP] Japan .................................. 8-259941

[51] Int. Cl.⁶ .................................................. H03M 1/78
[52] U.S. Cl. .......................................... 341/136; 341/154
[58] Field of Search ................................. 341/136, 144, 341/153, 154

[56] References Cited

U.S. PATENT DOCUMENTS

| | | | |
|---|---|---|---|
| 4,415,883 | 11/1983 | Von Sichart | 341/133 |
| 4,635,038 | 1/1987 | Wincn | 341/136 |
| 4,683,458 | 7/1987 | Hallgren | 341/127 |
| 5,455,582 | 10/1995 | Valdenaire | 341/154 |
| 5,525,986 | 6/1996 | Kovacs et al. | 341/136 |

*Primary Examiner*—Marc S. Hoff
*Attorney, Agent, or Firm*—Banner & Witcoff

[57] ABSTRACT

The present invention provides a D/A converter which has a small area in the chip, a linear current output and a high-speed operation. Each of resistors $R_{11}$–$R_{n1}$ in a resistor train $11a$ is composed of four MOS transistors which are connected in parallel with each other and each of resistors $R_{12}$–$R_{n2}$ in a resistor train $11b$ is composed of four MOS transistors which are connected in parallel with each other. Between the connecting nodes of the resistor trains $11a$, $11b$, MOS transistors $ST_{11}$, $ST_{12}$, $ST_{13}$, $ST_{14}$–$ST_{n1}$, $ST_{n2}$, $ST_{n3}$ and $ST_{n4}$ which serve as switches and resistors are connected. All the MOS transistors have the same conductive type and size. Gate control signals $C_{11}$–$C_{n1}$; $C_{12}$–$C_{n2}$ turn MOS transistors ON but each of them has a different voltage value. A current difference between the output terminals $Za$ and $Zb$ is converted into a voltage difference by an operational amplifier or the like.

11 Claims, 3 Drawing Sheets

D/A CONVERTER

BACKGROUND OF THE INVENTION

1. Field of the Invention

The present invention relates to the improvement of D/A converters which convert digital data into analog data.

2. Description of the Related Art

FIG. 4 shows an example of a conventional D/A converter. A resistor train 10 is composed of n pieces of resistors $R_1, R_2, \ldots R_n$ connected in series to each other. One end of the resistor train 10 is connected to a power source node X and the other end is connected to an intermediate node P. Among connecting nodes of the resistors $R_1, R_2, \ldots R_n$, the intermediate node P and an output terminal Z and a ground node GND, resistors $r_1, r_2, \ldots r_n$ and switch circuits $S_1, S_2, \ldots S_n$ are connected. Further, between the intermediate node P and the ground node GND, a resistor $r_{n+1}$ is connected.

All the resistors $R_1, R_2, \ldots R_n$ have the same resistance value, R. All the resistors $r_1, r_2, \ldots r_n, r_{n+1}$ have the same resistance value, 2R. These resistors comprise a well known ladder-type resistor circuit and a combined resistance of $R_2, R_3, \ldots R_n$ and $r_1, r_2, \ldots r_n, r_{n+1}$ is R.

A reference voltage is supplied to the power source node X and the ground voltage is supplied to the ground node GND. The output terminal Z is connected to, for instance, an operational amplifier and analog output data is obtained from an output of this operational amplifier.

Switch circuits $S_1, S_2, \ldots S_n$ connect either one of the output terminal Z and the ground node GND to the power source node X. In FIG. 4, for instance, the switch circuit $S_1$ connects the power source node X and the output terminal Z while the switch circuits $S_2, S_3, \ldots S_n$ connect the power source node X and the ground node GND.

N-bit gate control signals $D_1, D_2, \ldots D_n$ control the switch circuits $S_1, S_2, \ldots S_n$. The most significant bit (MSB) first bit $D_1$ of the gate control signals is input to the switch circuit $S_1$ and the least significant bit (LSB) $D_n$ is input to the switch circuit $S_n$. Activating bits of the gate control signals bits changes over the switch circuits so that the power source node X and the output terminal Z are connected.

When voltage VX, which is not equal to ground voltage GND, is supplied to the power source node X, current IX (=VX/2R) flows to the resistor $R_1$. A combined resistance of the resistors $R_2, R_3, \ldots R_n$ and the resistors $r_1, r_2, \ldots r_n, r_{n+1}$ is R and a resistance value of the resistor $R_1$ is R, thus the current IX flows to the resistor $R_1$.

This current IX is branched and flows to the resistor $r_1$ and the resistor $R_2$, respectively. The resistance of the resistor $r_1$ (2R) is equal to the combined resistance of the resistors $R_2, R_3, \ldots R_n$ and the resistors $r_2, r_3, \ldots r_n, r_{n+1}$ (2R). So, the current IX/2 (=VX/4R) flows to both the resistors $r_1$ and $R_2$.

From a similar viewpoint, current IX/21, IX/22, . . . IX/2n flow to the resistors $r_1, r_2, \ldots r_n$. In other words the currents flowing to the resistors $r_1, r_2, \ldots r_n$ are weighted by the power of 2.

Accordingly, because the power source node X and the output terminal Z are connected by the gate control signals $D_1, D_2, \ldots D_n$, weighted current flowing through the switches $S_1, S_2, \ldots S_n$ can be taken out of the output terminal Z according to the gate control signals $D_1, D_2, \ldots D_n$. Thereafter, the digital-to-analog conversion is carried out by an operational amplifier connected to the output terminal Z.

However, the D/A converter described above has defects as shown below. First, since the resistors $R_1, R_2, \ldots R_n$ and the resistors $r_1, r_2, \ldots r_n, r_{n+1}$ are composed of polysilicon resistors or diffusion resistors, a chip area containing an applicable D/A converter will become large. Second, since the switch circuits $S_1, S_2, \ldots S_n$ are composed of MOS transistors, the relation of resistance ratio among the resistors $R_1, R_2, \ldots R_n$ and the resistors $r_1, r_2, \ldots r_n, r_{n+1}$ is adversely affected by the ON resistance of the MOS transistors. Third, since voltage required for turning on/off the switch circuits $S_1, S_2, \ldots S_n$ is large, it is disadvantageous for high-speed operation and for the characteristics of the converter resulting from deviations in the manufacturing process.

FIG. 5 shows another conventional D/A converter. In this D/A converter, the resistors $R_1, R_2, \ldots R_n$ shown in FIG. 4 are substituted by N-channel MOS transistors $T_{11}, T_{12}, T_{21}, T_{22}, \ldots T_{n1}, T_{n2}$, respectively and the resistors $r_1, r_2, \ldots r_n$ and the switch circuits $S_1, S_2, \ldots S_n$ shown in FIG. 4 are substituted by N-channel MOS transistors $ST_{11}, ST_{12}, ST_{21}, ST_{22}, \ldots ST_{n1}, ST_{n2}$, respectively. Further, the resistor $r_{n+1}$ is substituted by an N-channel MOS transistor $ST_{n+1}$.

All the MOS transistors $T_{11}, T_{12}, T_{21}, T_{22}, \ldots T_{n1}, T_{n2}$; $ST_{11}, ST_{12}, ST_{21}, ST_{22}, \ldots ST_{n1}, ST_{n2}$; $ST_{n+1}$ have the same conductive type and the same size (the driving force). Voltage VX that is applied to the power source node X is set at a value to operate all the MOS transistors in a non-saturated region.

The resistor $R_1$ is composed of two MOS transistors $T_{11}, T_{12}$ which are connected in parallel with each other, the resistor $R_2$ is composed of two MOS transistors $T_{21}, T_{22}$ which are connected in parallel with each other and, similarly, the resistor $R_n$ is composed of two MOS transistors $T_{n1}, T_{n2}$ which are connected in parallel with each other. And the gates of MOS transistors $T_{11}, T_{12}, T_{21}, T_{22}, \ldots T_{n1}, T_{n2}$ are connected to a bias node which is supplied with voltage $V_{DD}$.

The resistor $r_1$ and the switch circuit $S_1$ shown in FIG. 4 are composed of the MOS transistor $ST_{11}$ connected to the output terminal Z and the MOS transistor $ST_{12}$ connected to the ground node GND. And similarly, the resistor $r_n$ and the switch circuit $S_n$ shown in FIG. 4 are composed of the MOS transistor $ST_{n1}$ connected to the output terminal Z and the MOS transistor $ST_{n2}$ connected to the ground node GND.

A control signal $C_1$ is applied to the gate of MOS transistor $ST_{11}$ and a control signal $C_1$ inverse is applied to the gate of MOS transistor $ST_{12}$. Similarly, a control signal $C_n$ is applied to the gate of MOS transistor $ST_{n1}$, and a control signal $C_n$ inverse is applied to the gate of MOS transistor $ST_{n2}$.

N-channel MOS transistors were used above but P channel MOS transistors may be used instead of them.

On a D/A converter constructed as described above, assuming that voltage applied between the drain and source of each MOS transistor is $V_{ds}$ and gate voltage is Vb, the drain to source current Ids will be $$I_{ds} = K\{2(Vb-Vt)V_{ds} - V_{ds}^2\} \quad (1)$$

$$K = (W/2L) \cdot (\epsilon_{si}/t_{ox})\mu,$$

where W is a channel width, L is a channel length, $\epsilon_{si}$ is a dielectric constant of a gate insulator (silicon oxide layer), $t_{ox}$ is a thickness of a gate insulator, $\mu$ is the mobility of carriers in the channel and Vt is a voltage threshold of the MOS transistor.

According to the structure described above, it is possible to make a chip area small because the ON resistance of MOS transistors is used instead of the resistors from polysilicon and/or diffusion layers.

However, as can be seen from the above Equation (1), the current $I_{ds}$ has non-linearity as it contains the term $V_{ds}^2$. The variation of characteristics resulting from deviations in the manufacturing process becomes large. Further, since a large voltage is required to turn on/off the MOS transistors $ST_{11}$, $ST_{12}$, $ST_{21}$, $ST_{22}$, ... $ST_{n+1}$, it is disadvantageous for high speed operation.

SUMMARY OF THE INVENTION

The present invention provides a D/A converter for high speed operation.

The present invention provides a D/A converter comprising: a converter unit comprising: a first MOS transistor, which source is connected to a first power source node; a second MOS transistor, which source is connected to a second power source node and which drain is connected to a drain of the first MOS transistor; a third MOS transistor, which source is connected to the first power source node; a fourth MOS transistor, which source is connected to the second power source node and which drain is connected to a drain of the third MOS transistor; a first output node connected to the drains both of the first MOS transistor and the second MOS transistor; a second output node connected to the drains both of the third MOS transistor and the fourth MOS transistor; a first control node connected to gates of the first MOS transistor and the fourth MOS transistor, and supplied with a first voltage based on a digital data bit; a second control node connected to gates of the second MOS transistor and the third MOS transistor, and supplied with a second voltage based on digital data different from the first voltage; wherein the first and the second and the third and the fourth MOS transistors have the same size and operate in the non-saturated region by the first and the second voltage; a first output terminal connected to the first output nodes of the converter units; and a second output terminal connected to the second output nodes of the converter units; wherein a first power potential is supplied to the first power source node of a first converter unit and a second power potential is supplied to the second power source node of the first converter unit, a half of the potential at the first power source node of the (n−1)th converter unit is supplied to the first power source node of an nth converter unit and a half of the potential at the second power source node of the (n−1)th converter unit is supplied to the second power source node of the nth converter unit.

The present invention also provides a D/A converter treating k-bit data comprising: ($2^k-1$) units of converter unit comprising: a first MOS transistor, which source is connected to a first power source node; a second MOS transistor, which source is connected to a second power source node and which drain is connected to a drain of the first MOS transistor; a third MOS transistor, which source is connected to the first power source node; a fourth MOS transistor, which source is connected to the second power source node and which drain is connected to a drain of the third MOS transistor; a first output node connected to the drains both of the first MOS transistor and the second MOS transistor; a second output node connected to the drains both of the third MOS transistor and the fourth MOS transistor; a first control node connected to gates of the first MOS transistor and the fourth MOS transistor, and supplied with a first voltage based on converted digital data; a second control node connected to gates of the second MOS transistor and the third MOS transistor, and supplied with a second voltage based on the converted digital data different from the first voltage; wherein the first and the second and the third and the fourth MOS transistors have the same size and operate in the non-saturated region by the first and the second voltage; a first output terminal connected to the first output nodes of the converter units; and a second output terminal connected to the second output nodes of the converter units, wherein the first power source nodes of the converter units are connected and the second power source nodes of the converter units are connected, and $2^j$ ($0 \leq j \leq k-1$) units of the converter unit are controlled simultaneously.

DETAILED DESCRIPTION OF THE PREFERRED EMBODIMENTS

Figure 1:
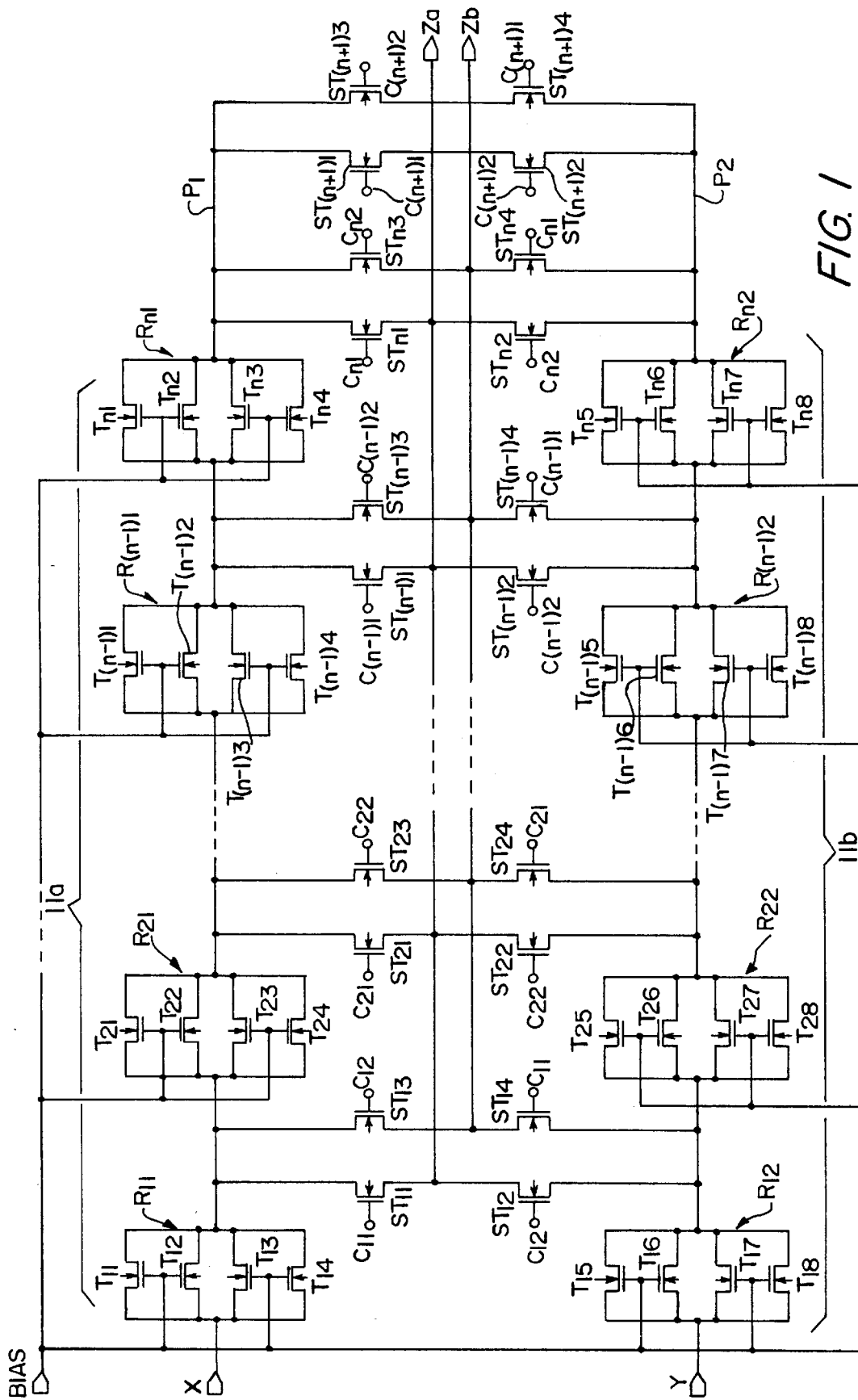
FIG. 1 is a diagram showing a D/A converter according to the present invention.

FIG. 1 shows a D/A converter according to the present invention. One end of a resistor train 11a is connected to a power source node X and the other end is connected to an intermediate node P1. The resistor train 11a is composed of n pieces of resistors $R_{11}$, $R_{21}$, ... $R_{n1}$ which are connected in series with each other. Each resistor is composed of four N-channel MOS transistors which are connected in parallel with each other. For instance, the resistor $R_{11}$ is composed of four N-channel MOS transistors $T_{11}$, $T_{12}$, $T_{13}$, $T_{14}$ which are connected in parallel with each other, the resistor 21 is composed of four N-channel MOS transistors $T_{21}$, $T_{22}$, $T_{23}$, $T_{24}$ which are connected in parallel with each other and, similarly, the resistor $R_{n1}$ is composed of four N-channel MOS transistors $T_{n1}$, $T_{n2}$, $T_{n3}$, $T_{n4}$ which are connected in parallel with each other.

One end of a resistor train 11b is connected to a power source node Y and the other end is connected to an intermediate node P2. The resistor train 11b is composed of n pieces of resistors $R_{12}$, $R_{22}$, ... $R_{n2}$ which are connected in series with each other. Each resistor is composed of four N-channel MOS transistors which are connected in parallel with each other. For instance, the resistor $R_{12}$ is composed of four N-channel MOS transistors $T_{15}$, $T_{16}$, $T_{17}$, $T_{18}$ which are connected in parallel with each other, the resistor $R_{22}$ is composed of four N-channel MOS transistors $T_{25}$, $T_{26}$, $T_{27}$, $T_{28}$ which are connected in parallel with each other and similarly, the resistor $R_{n2}$ is composed of four N-channel MOS transistors $T_{n5}$, $T_{n6}$, $T_{n7}$, $T_{n8}$ which are connected in parallel with each other.

The resistor trains 11a and 11b are in the same structure. Between the connecting nodes of the resistors $R_{11}$, $R_{21}$, ... $R_{n1}$ of the resistor train 11a and the connecting nodes of the resistors $R_{12}$, $R_{22}$, ... $R_{n2}$ of the resistor train 11b, two N-channel MOS transistors which are connected in series are inserted.

For instance, between the connecting node of the resistors $R_{11}$, $R_{12}$ and the connecting node of the resistors $R_{12}$, $R_{22}$, N-channel MOS transistors $ST_{11}$, $ST_{12}$ which are connected in series and N-channel MOS transistors $ST_{13}$, $ST_{14}$ which are connected in series are inserted, respectively. Similarly, between the connecting node of the resistors $R_{(n-1)1}$, $R_{n1}$ and the connecting node of the resistors $R_{(n-1)2}$, $R_{n2}$, N-channel MOS transistors $ST_{(n-1)1}$, $ST_{(n-1)2}$ which are connected in series and $ST_{(n-1)3}$, $ST_{(n-1)4}$ which are connected in series are inserted, respectively.

Between the intermediate node P1 of the resistor train 11a and the intermediate node P2 of the resistor train 11b, four pairs of N-channel MOS transistors $ST_{n1}$ and $ST_{n2}$, $ST_{n3}$ and $ST_{n4}$, $ST_{(n+1)1}$ and $ST_{(n+1)2}$, and $ST_{(n+1)3}$ and $ST_{(n+1)4}$, which are connected in series are inserted respectively.

The output terminal Za is connected to the connecting node of the MOS transistors $ST_{11}$, $ST_{12}$, the connecting node of the MOS transistors $ST_{21}$, $ST_{22}$ and, similarly, to the connecting node of the MOS transistors $ST_{n1}$, $ST_{n2}$, respectively. The output terminal Zb is connected to the connecting node of the MOS transistors $ST_{13}$, $ST_{14}$, the connecting node of the MOS transistors $ST_{23}$, $ST_{24}$ and similarly, to the connecting node of the MOS transistors $ST_{n3}$, $ST_{n4}$, respectively. All the MOS transistors have the same conductive type and size (the driving force).

To the gates of the MOS transistors $ST_{11}$, $ST_{21}$, ... $ST_{n1}$, $ST_{(n+1)1}$; $ST_{14}$, $ST_{24}$, ... $ST_{n4}$, $ST_{(n+1)4}$, the gate control signals $C_{11}$, $C_{21}$, ... $C_{(n+1)1}$ are input.

The gate control signal $C_{11}$ which is supplied to the MOS transistor $ST_{11}$ and $ST_{14}$ is an MSB in the gate control signals $C_{11}$, $C_{21}$, ... $C_{(n+1)1}$ and the gate control signal $C_{(n+1)1}$ which is supplied to the MOS transistor $ST_{(n+1)1}$ and $ST_{(n+1)4}$ is an LSB in the gate control signals $C_{11}$, $C_{21}$, ... $C_{(n+1)1}$. The gate control signals $C_{11}$, $C_{21}$, ... $C_{(n+1)1}$ have one of two different voltages Va, Vb (Va>Vb) wherein both voltages retain values to make MOS transistors in the conductive state.

Similarly, the gate control signals $C_{12}$, $C_{22}$, ... $C_{(n+1)2}$ are supplied to the MOS transistors $ST_{12}$, $ST_{22}$, ... $ST_{(n+1)2}$; $ST_{13}$, $ST_{23}$, ... $ST_{(n+1)3}$.

The gate control signal $C_{12}$ which is supplied to the MOS transistor $ST_{12}$ and $ST_{13}$ corresponds to an MSB in the gate control signals $C_{12}$, $C_{22}$, ... $C_{(n+1)2}$ and the gate control signal $C_{(n+1)2}$ which is supplied to the MOS transistor $ST_{(n+1)2}$ and $ST_{(n+1)3}$ corresponds to an LSB in the gate control signals $C_{12}$, $C_{22}$, ... $C_{(n+1)2}$. The gate control signals $C_{12}$, $C_{22}$, ... $C_{(n+1)2}$ have one of two different voltages Va, Vb (Va>Vb). The gate control signals $C_{12}$ and $C_{21}$, $C_{21}$ and $C_{22}$, ... $C_{(n+1)1}$ and $C_{(n+1)2}$ are pairs, and one of the pair is Va when the other of the pair is Vb.

The gates of all MOS transistors comprising the resistor trains 11a and 11b are connected to a bias node BIAS. For instance, a voltage of $(C_{11}+C_{12})/2$ is applied to the bias node BIAS.

The D/A converter may be so constructed that the voltage $C_{11}$ is applied to the MOS transistors $T_{11}$, $T_{21}$, ... $T_{n1}$; $T_{12}$, $T_{22}$, ... $T_{n2}$, the voltage $C_{12}$ is applied to the MOS transistors $T_{13}$, $T_{23}$, ... $T_{n3}$; $T_{14}$, $T_{24}$, ... $T_{n4}$, the voltage $C_{12}$ is applied to the MOS transistors $T_{15}$, $T_{25}$, ... $T_{n5}$; $T_{16}$, $T_{26}$, ... $T_{n6}$ and the voltage $C_{11}$ is applied to the MOS transistors $T_{17}$, $T_{27}$, ... $T_{n7}$; $T_{18}$, $T_{28}$, ... $T_{n8}$.

Voltage VX which is applied to the power source node X and voltage VY which is applied to the power source node Y are chosen so that all the MOS transistors operate in the non-saturated region. And voltages of the output terminals Za, Zb are kept at $(VX+VY)/2$.

A converter circuit to convert a current difference into a voltage difference (for instance, a difference operation amplifier) is connected to the output terminals Za, Zb. The converter circuit detects a current difference between a current Iza which flows from the power source nodes X, Y to the output terminal Za and a current Izb which flows from the power source nodes X, Y to the output terminal Zb.

A D/A converter according to the present invention may use P-channel MOS transistors instead of N-channel MOS transistors.

Therefore, a differential operational amplifier D/A converter is obtained.

The operation of the D/A converter according to the present invention will be described below with reference to FIG. 2. A converter unit consists of a pair of MOS transistors $T_1$ and $T_3$ between the power source nodes A, B, which are connected in series, and a pair of MOS transistors $T_2$ and $T_4$ between the power source nodes A, B, which are connected in series. Output node G is connected to the node between the MOS transistors $T_1$ and $T_3$, and output node H is connected to the node between the MOS transistors $T_2$ and $T_4$.

Voltage supplied to the gates of the MOS transistors $T_1$, $T_4$ is voltage Vga and voltage supplied to the gates of the MOS transistors $T_2$, $T_3$ is voltage Vgb. Both voltage Vga and Vgb set them in the conductive state, but the values of the voltage Vga and Vgb are different from each other. FIG. 2 shows a case of Vga>Vgb.

When the voltages at the output nodes G, H are made the same, a difference between a current Ig which flows to the output node G and a current Ih flows from the output node H becomes as follows:

$$(Ig-Ih)=2K(Vga-Vgb)(V_1-V_3) \qquad (2)$$

$$K=(W/2L)((\epsilon_{si}/t_{ox})\mu,$$

where voltages between drains and sources of the MOS transistors $T_1$, $T_2$, $T_3$, $T_4$ are $V_1$, $V_2$, $V_3$, $V_4$ respectively, W is a channel width, L is a channel length, $\epsilon_{si}$ is a dielectric constant of the gate insulator (the silicon oxide),$t_{ox}$ is a thickness of the gate insulator and $\mu$ is the carrier mobility in the channel. $V_1$, $V_2$, $V_3$ and $V_4$ have values at where the MOS transistors are set in the non-saturated state. And $V_1$ is equal to $V_2$ and $V_3$ is equal to $V_4$ because the voltages at the output nodes G, H are the same.

As can be seen from the Equation (2), the difference between the current Ig flowing to the output node G and the current Ih flowing from the output node H is in proportion to the gate voltage difference (Vga−Vgb) of the MOS transistors. After this current difference is converted into a voltage difference by an differential operational amplifier, the digital-to-analog conversion is completed.

Figure 2:
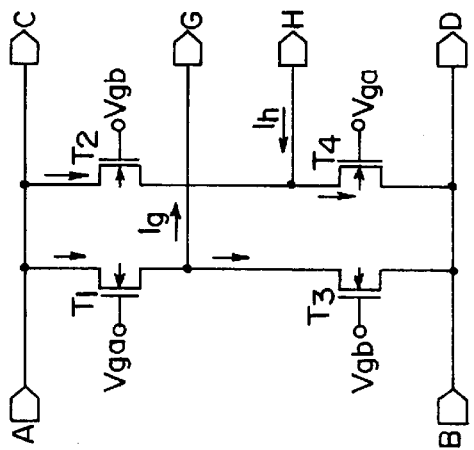
FIG. 2 is a diagram showing the principle of operation of the D/A converter shown in FIG. 1.

Accordingly, the difference in the currents flowing to two current output nodes (the output terminals Za, Zb) is in proportion to a gate voltage difference (Va−Vb) of the MOS transistors because the D/A converter in FIG. 1 consists of units of the four-transistor circuit in FIG. 2. The gate voltages Va and Vb of the MOS transistors can control the output current at the output terminals Za and Zb linearly.

Further, when the output nodes G, H are kept to a half voltage between the power source nodes A, B, namely $V_1$ is equal to $V_3$, the difference of the current between the output node G and the output node H is constantly zero. That is, the current difference (Ig−Ih) is zero and the currents at the output nodes H, G are Ig=Ih. Because the current Ig flows to the output node G and the current Ih flows from the output node H, the differential operation amplifier connected to the output node G, H detects twice the current of Ig, 2Ig. Therefore, when Vga>Vgb, the differential operational amplifier detects the current 2Ig, and when Vga<Vgb, the differential operational amplifier detects the current −2Ig.

Therefore, the present invention provides a D/A converter which has a small chip area because of using the MOS transistors, which outputs a current in a shape close to a linear shape and which requires a small switching voltage.

Figure 3:
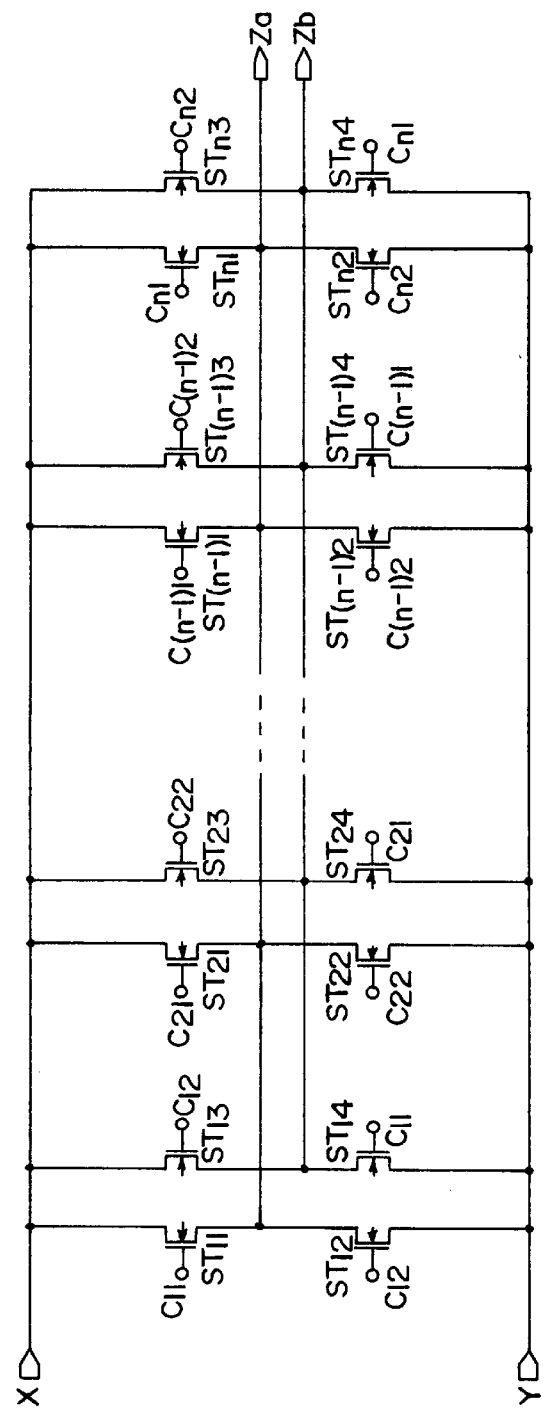
FIG. 3 is a diagram showing a D/A converter according to the present invention.
Figure 4:
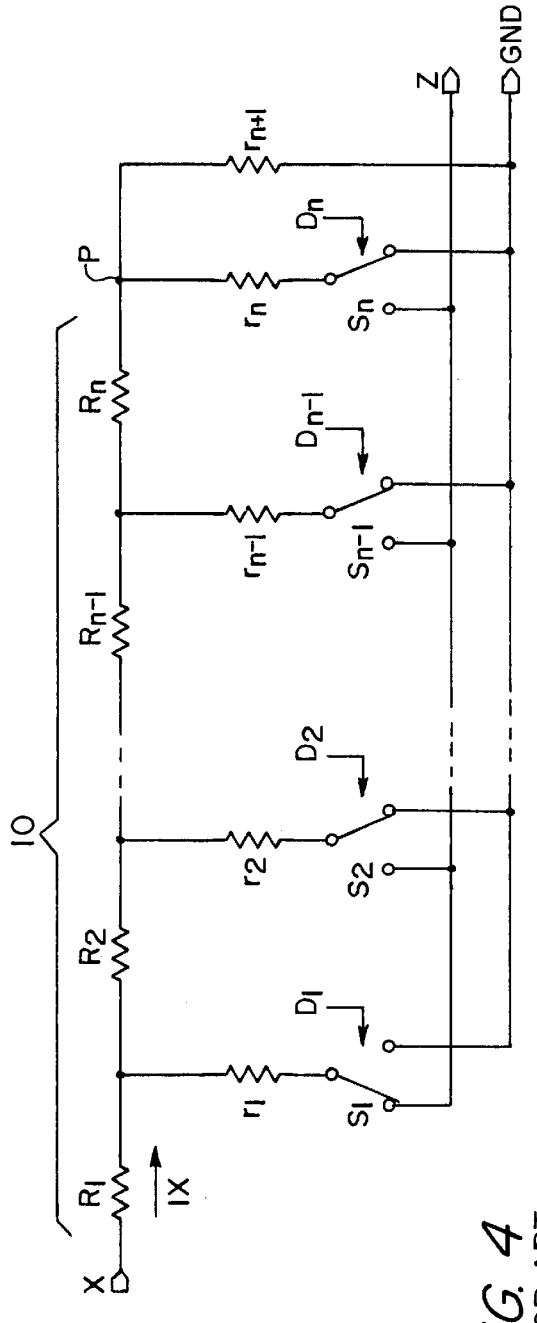
FIG. 4 is a diagram showing a conventional D/A converter.
Figure 5:
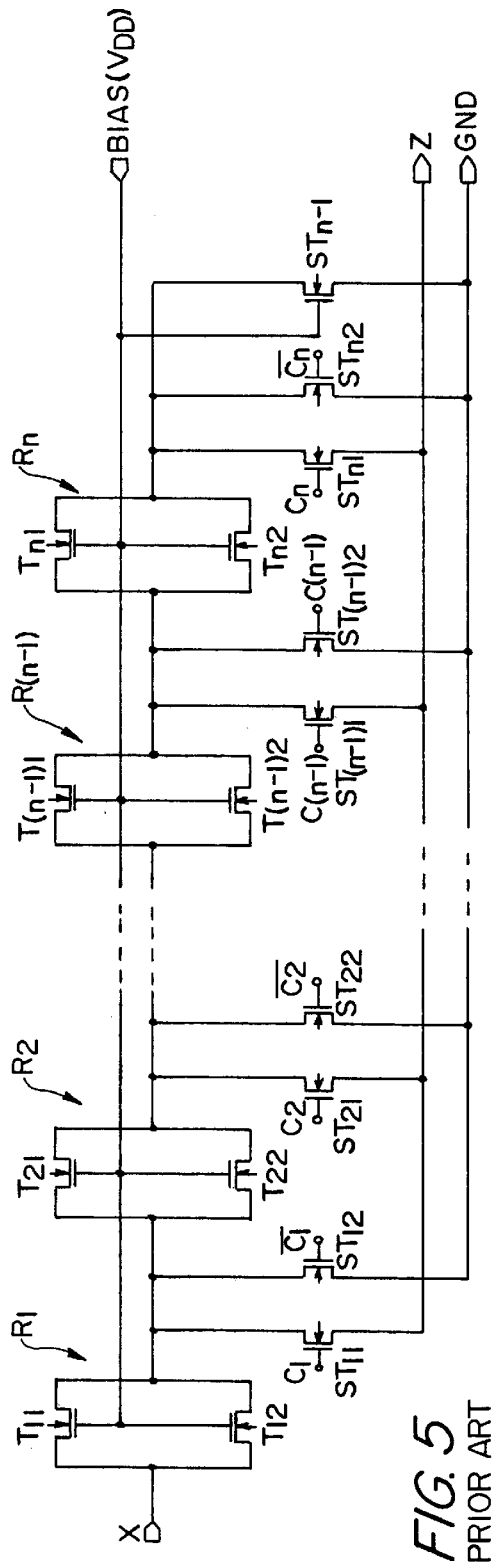
FIG. 5 is a diagram showing a conventional D/A converter.

FIG. 3 shows a D/A converter of a second embodiment according to the present invention. Between the power source nodes X and Y, two pairs of N-channel MOS transistors $ST_{11}$ and $ST_{12}$, and $ST_{13}$ and $ST_{14}$, which are connected in series, are connected respectively. Similarly, between the power source nodes X and Y, two pairs of N-channel MOS transistors $ST_{j1}$ and $ST_{j2}$, and $ST_{j3}$ and $ST_{j4}$ ($1 \leq j \leq n$), which are connected in series, are connected respectively. When the D/A converter can treat k-bit data, $n=(2^k-1)$.

All the MOS transistors have the same conductive type and the sizes (the driving force).

The output terminal Za is connected to the connecting node of the MOS transistors $ST_{11}$, ST12, to the connecting node of the MOS transistors $ST_{21}$, $ST_{22}$ and similarly, to the connecting node of the MOS transistors $ST_{j1}$, $ST_{j2}$, respectively. The output terminal Zb is connected to the connecting node of the MOS transistors $ST_{13}$, $ST_{14}$, to the connecting node of the MOS transistors $ST_{23}$, $ST_{24}$ and similarly, to the connecting node of the MOS transistors $ST_{j3}$, $ST_{j4}$, respectively.

Gate control signals $C_{11}, C_{21}, \ldots C_{n1}$ which are based on the input digital data are input to the gates of the MOS transistors $ST_{11}, ST_{21}, \ldots ST_{n1}; ST_{14}, ST_{24}, \ldots ST_{n4}$. Gate control signals $C_{12}, C_{22}, \ldots C_{n2}$ are input to the gates of the MOS transistors $ST_{12}, ST_{22}, \ldots ST_{n2}; ST_{13}, ST_{23}, \ldots ST_{n3}$.

The circuit shown in FIG. 2 consists of a unit of the MOS transistors $ST_{j1}, ST_{j2}, ST_{j3}$ and $ST_{j4}$. Hereinafter, $ST_{j1}, ST_{j2}, ST_{j3}$ and $ST_{j4}$ are expressed as a unit of $ST_j$.

Gate control signals $C_{11}, C_{21}, \ldots C_{n1}$ are supplied to the gates of the MOS transistors $ST_{11}, ST_{21}, \ldots ST_{n1}; ST_{14}, ST_{24}, \ldots ST_{n4}$. In the gate control signals $C_{11}, C_{21}, \ldots C_{n1}$, the gate control signal $C_{11}$ which is supplied to the MOS transistor $ST_{11}$ and $ST_{14}$ corresponds to the LSB and the gate control signal $C_{n1}$ which is supplied to the MOS transistor $ST_{n1}$ and $ST_{n4}$ is the MSB. And one of two different voltages Va, Vb (Va>Vb) is selected to the gate control signals $C_{11}, C_{21}, \ldots C_{n1}$.

Gate control signals $C_{12}, C_{22}, \ldots C_{n2}$ are supplied to the gates of the MOS transistors $ST_{12}, ST_{22}, \ldots ST_{n2}; ST_{13}, ST_{23}, \ldots ST_{n3}$. In the gate control signals $C_{12}, C_{22}, \ldots C_{n2}$, the gate control signal $C_{12}$ which is supplied to the MOS transistor $ST_{12}$ and $ST_{13}$ is based on the LSB and the gate control signal $C_{n2}$ which is supplied to the MOS transistor $ST_{n2}$ and $ST_{n3}$ is based on the MSB. And the gate control signals are one of two different voltages Va, Vb (Va>Vb), which is not applied to the gates of the MOS transistors $ST_{11}, ST_{21}, \ldots ST_{n1}; ST_{14}, ST_{24}, \ldots ST_{n4}$.

Voltage VX which is applied to the power source node X and voltage VY which is applied to the power source node Y are chosen so that all the MOS transistors operate in the non-saturated region. Voltages at the output terminals Za, Zb are kept at (VX+VY)/2.

When the LSB is expressed by the unit of ST1, the next bit is expressed by the units of $ST_2$ and $ST_3$ because two times the current volume is required to express the next bit. That is, the next bit is expressed by supplying simultaneously the gate control signals $C_{21}=C_{31}$ and $C_{22}=C_{32}$ to two units of $ST_2$ and $ST_3$.

For instance, in a case of 4-bit data, $n=(24-1)=15$ units of STj are required. It is required to express 16 kinds of state and 15 units of STj are provided correspondingly. The LSB is expressed by $ST_1$, the next bit expressed by $ST_2$ and $ST_3$, the third bit is expressed by $ST_4$–$ST_7$ and the MSB is expressed by $ST_8$–$ST_{15}$.

When a digital datum (0000) is input, the gate control signals are $C_{11}=C_{21}= \ldots =C_{(n-1)1}=Vb$, $C_{12}=C_{22}= \ldots =C_{(n-1)2}=Va$ (Va>Vb). Then all STj output the current −2I, so that the current detected by the convert circuit is totally −30I. When a digital datum (0001) is input, the gate control signals are $C_{11}=Va$; $C_{21}=C_{31}= \ldots =C_{(n-1)1}=Vb$, $C_{12}=Vb$; $C_{22}=C_{32}= \ldots =C_{(n-1)2}=Va$ (Va>Vb). Then $ST_1$ outputs +2I and the other STj output −2I respectively, so that the current detected is −26I. When a digital datum (0010) is input, the gate control signals are $C_{11}=Vb$; $C_{21}=C_{31}=Va$; $C_{41}=C_{51}= \ldots =C_{(n-1)1}=Vb$, $C_{12}=Va$; $C_{22}=C_{32}=Vb$; $C_{42}=C_{52}= \ldots =C_{(n-1)2}=Va$. Then each of $ST_2$ and $ST_3$ outputs +2I and the other STj output −2I respectively, so that the current detected is −22I. When a digital datum (0011) is input, the gate control signals are $C_{11}=C_{21}=C_{31}=Va$; $C_{41}= \ldots =C_{(n-1)1}=Vb, C_{21}=C_{12}=C_{32}=Vb$; $C_{42}= \ldots =C_{(n-1)2}=Va$. Then each of $ST_1$, $ST_2$ and $ST_3$ output +2I and the other STj output −2I respectively, so that the current detected is −22I. Similarly when a digital datum (1111) is input, the gate control signals are $C_{11}=C_{21}= \ldots =C_{(n-1)1}=Va$; $C_{12}=C_{22}= \ldots =C_{(n-1)2}=Vb$. Then all STj output +2I, so that the current detected is totally +30I. And these detected currents are converted to the graded voltages.

A converter circuit to convert a current difference into a voltage difference (e.g., a differential operational amplifier) is connected to the output terminals Za, Zb. The circuit to convert detects a current difference between a current (Iza) flowing from the power source nodes X, Y to the output terminal Za and a current (Izb) flowing from the power source nodes X, Y to the output terminal Zb. Therefore, a differential digital-to-analog converter is constructed.

It is also possible to construct a D/A converter using P channel MOS transistors instead of N-channel MOS transistors.

According to a D/A converter according to the present invention, a difference in the currents flowing to two output terminals Za, Zb is in proportion to a gate voltage difference of the MOS transistors. Therefore, an output current in almost linear shape is obtained by controlling gate control signals $C_{11}, C_{21}, \ldots C_{n1}; C_{12}, C_{22}, \ldots C_{n2}$. And the D/A converter has a small chip area and a small switching voltage.

The present invention can be applied to a D/A converter which has various MOS transistor sizes (the driving potential).

Because all resistors and switch circuits are composed of MOS transistors, the chip area containing a D/A converter is small. Because MOS transistors make pairs, the output current has almost linear shape.

What is claimed is:

1. A digital to analog converter circuit comprising:
   a converter unit comprising:
   a first MOS transistor, which source is connected to a first power source node;
   a second MOS transistor, which source is connected to a second power source node and which drain is connected to a drain of the first MOS transistor;
   a third MOS transistor, which source is connected to the first power source node;
   a fourth MOS transistor, which source is connected to the second power source node and which drain is connected to a drain of the third MOS transistor;
   a first output node connected to the drains both of the first MOS transistor and the second MOS transistor;
   a second output node connected to the drains both of the third MOS transistor and the fourth MOS transistor;

a first control node connected to gates of the first MOS transistor and the fourth MOS transistor, and supplied with a first voltage based on a digital data bit;
a second control node connected to gates of the second MOS transistor and the third MOS transistor, and supplied with a second voltage based on the digital data bit and different from the first voltage;
wherein the first and the second and the third and the fourth MOS transistors have the same size and operate in the non-saturated region by the first and the second voltage;
a first output terminal connected to the first output node of the converter unit; and
a second output terminal connected to the second output node of the converter unit.

2. A device comprising first and second digital to analog converter circuits each as recited in claim 1,
wherein a first power potential is supplied to the first power source node of the first digital to analog converter circuit and a second power potential is supplied to the second power source node of the first digital to analog converter circuit; and
wherein half of the first power potential is supplied to a first power source node of the second digital to analog converter circuit and half of the second power potential is supplied to a second power source node of the second digital to analog converter circuit.

3. The device according to claim 2,
wherein the first and second control nodes of the first digital to analog converter circuit are supplied with voltages based on a most significant bit; and
wherein the first and second control nodes of the second digital to analog converter circuit are supplied with voltages based on a less significant bit.

4. The device according to claim 1, further comprising:
a current to voltage converter circuit coupled to the first and second output terminals,
wherein the current to voltage converter circuit converts a current difference between the first and second output terminals into a voltage difference.

5. A digital to analog converter device comprising:
a plurality of converter units each comprising:
a first MOS transistor, which source is connected to a first power source node;
a second MOS transistor, which source is connected to a second power source node and which drain is connected to a drain of the first MOS transistor;
a third MOS transistor, which source is connected to the first power source node;
a fourth MOS transistor, which source is connected to the second power source node and which drain is connected to a drain of the third MOS transistor;
a first output node connected to the drains both of the first MOS transistor and the second MOS transistor;
a second output node connected to the drains both of the third MOS transistor and the fourth MOS transistor;
a first control node connected to gates of the first MOS transistor and the fourth MOS transistor, and supplied with a first voltage based on a digital data bit;
a second control node connected to gates of the second MOS transistor and the third MOS transistor, and supplied with a second voltage based on the digital data bit and different from the first voltage;
wherein the first and the second and the third and the fourth MOS transistors have the same size and operate in the non-saturated region by the first and the second voltage;
a first output terminal connected to the first output nodes of each of the converter units; and
a second output terminal connected to the second output nodes of each of the converter units;
first resistors between the first power source nodes of the respective converter units, having the same resistance;
second resistors between the second power source nodes of the respective converter units, having the same resistance as the first resistors; and
an end resistor between the first power source node and the second power source node of the last of the plurality of converter units.

6. The digital to analog converter device according to claim 5, wherein the first, the second and the end resistors consist of MOS transistors.

7. The digital to analog converter device according to claim 5, wherein the first and the second control nodes of a first of the plurality of converter units are supplied with voltages based on a most significant bit and the first and the second control nodes of a last of the plurality of units are supplied with voltages based on a least significant bit.

8. The digital to analog converter device according to claim 5, further comprising:
a current to voltage converter circuit coupled to the first and second output terminals,
wherein the current to voltage converter circuit converts a current difference between the first and second output terminals into a voltage difference.

9. A digital to analog converter device treating k-bit data comprising:
($2^k$–1) converter units, each converter unit comprising:
a first MOS transistor, which source is connected to a first power source node;
a second MOS transistor, which source is connected to a second power source node and which drain is connected to a drain of the first MOS transistor;
a third MOS transistor, which source is connected to the first power source node;
a fourth MOS transistor, which source is connected to the second power source node and which drain is connected to a drain of the third MOS transistor;
a first output node connected to the drains both of the first MOS transistor and the second MOS transistor;
a second output node connected to the drains both of the third MOS transistor and the fourth MOS transistor;
a first control node connected to gates of the first MOS transistor and the fourth MOS transistor, and supplied with a first voltage based on a digital data bit;
a second control node connected to gates of the second MOS transistor and the third MOS transistor, and supplied with a second voltage based on the digital data bit and different from the first voltage;
wherein the first and the second and the third and the fourth MOS transistors have the same size and operate in the non-saturated region by the first and the second voltage;
a first output terminal connected to the first output nodes of the converter units; and
a second output terminal connected to the second output nodes of the converter units,
wherein the first power source nodes of the converter units are connected and the second power source nodes of the converter units are connected, and $2^j$ ($0 \leq j \leq k-1$) units of the converter unit are controlled simultaneously.

10. The digital to analog converter device of claim 9, wherein the first and the second voltages of the first converter unit are based on a least significant data bit and the first and the second voltages of the last $2^{(k-1)}$ units of the converter unit are based on a most significant data bit.

11. The digital to analog converter device according to claim 10, further comprising:
a current converter circuit coupled to the first and second output terminals, wherein the current converter converts a current difference between the first and second output terminals into a voltage difference.

* * * * *